United States Patent
Yang

(10) Patent No.: US 9,310,858 B2
(45) Date of Patent: Apr. 12, 2016

(54) HEAT DISSIPATING MODULE WITH ENHANCED HEAT DISSIPATION EFFICIENCY AND ELECTRONIC DEVICE THEREWITH

(71) Applicant: Aopen Inc., New Taipei (TW)

(72) Inventor: Ching-Hung Yang, New Taipei (TW)

(73) Assignee: Aopen Inc., Xizhi Dist, New Taipei (TW)

( * ) Notice: Subject to any disclaimer, the term of this patent is extended or adjusted under 35 U.S.C. 154(b) by 236 days.

(21) Appl. No.: 13/944,883

(22) Filed: Jul. 18, 2013

(65) Prior Publication Data

US 2014/0098490 A1    Apr. 10, 2014

(30) Foreign Application Priority Data

Oct. 8, 2012    (TW) .............................. 101137096 A

(51) Int. Cl.
*H05K 7/20* (2006.01)
*G06F 1/20* (2006.01)
*H05K 1/02* (2006.01)
*H01L 23/40* (2006.01)

(52) U.S. Cl.
CPC ...... *G06F 1/20* (2013.01); *H01L 23/40* (2013.01); *H05K 1/0203* (2013.01); *H05K 7/20* (2013.01); *H05K 7/20445* (2013.01)

(58) Field of Classification Search
CPC ........ G06F 1/203; H01L 51/529; H05K 7/12; B23P 2700/10
See application file for complete search history.

(56) References Cited

U.S. PATENT DOCUMENTS

| | | | |
|---|---|---|---|
| 6,771,506 B2 * | 8/2004 | Lee et al. | ....................... 361/704 |
| 2008/0264613 A1 | 10/2008 | Chu | |
| 2009/0219687 A1 | 9/2009 | Lin | |

FOREIGN PATENT DOCUMENTS

| | | |
|---|---|---|
| TW | 200631491 | 9/2006 |
| TW | M383765 | 7/2010 |
| TW | M407417 | 7/2011 |

OTHER PUBLICATIONS

Office action mailed on Jun. 6, 2014 for the Taiwan application No. 101137096, filing date: Oct. 8, 2012, p. 2 line 7~26, p. 3~6 and p. 7 line 1~20.
Office action mailed on Sep. 30, 2015 for the China application No. 201210417169.8, p. 3 line 4~28, p. 4~5 and p. 6 line 1~8.

* cited by examiner

*Primary Examiner* — Robert J Hoffberg
*Assistant Examiner* — Hung Dang
(74) *Attorney, Agent, or Firm* — Winston Hsu; Scott Margo

(57) ABSTRACT

A heat dissipating module includes a main body, a heat dissipating unit and at least one resilient engaging unit. A side of the heat dissipating unit is connected to the main body and the other side of the heat dissipating unit contacts against at least one heat component. An end of the at least one resilient engaging unit is connected to a side of the main body and the other end of the at least one resilient engaging unit engages with a side of a fastening base. The at least one resilient engaging unit is for resiliently pressing the main body so that the dissipating unit contacts with the at least one heat component closely.

22 Claims, 10 Drawing Sheets

HEAT DISSIPATING MODULE WITH ENHANCED HEAT DISSIPATION EFFICIENCY AND ELECTRONIC DEVICE THEREWITH

BACKGROUND OF THE INVENTION

1. Field of the Invention

The invention relates to a heat dissipating module, and more specifically, to a heat dissipating module with enhanced heat dissipation efficiency for a memory of a system without a fan.

2. Description of the Prior Art

For meeting special requirement, a conventional electronic device is reduced to a small size. For example, as the electronic device is desired to be disposed in a narrow space or in a difficult environment, a fan for dissipating heat can not be configured in the electronic device. In addition, a heat dissipating mechanism for the electronic device without a fan is mainly considered for a CPU or a chipset. In the situation without any heat dissipating mechanism, a temperature of a memory component would be increased extremely so that an operation system of the electronic device works unstably. For solving the above problem, a conventional solution is to form more holes on a casing of the electronic device, so that heat generated by the memory component can be dissipated outside the electronic device via air convection. However, as the electronic device is desired to be dustproof and waterproof, or is desired to dispose no hole on the casing, the above solution cannot be applied to the electronic device. Therefore, it is an important issue to design a memory heat dissipating module with easy assembly and well heat dissipation efficiency to apply to the electronic device which is dustproof and waterproof, or has no hole on the casing.

SUMMARY OF THE INVENTION

The present invention is to provide heat dissipating module with enhanced heat dissipation efficiency to solve above problems.

According to the disclosure, a heat dissipating module fixed on a fastening base and contacting against at least one heat component. The heat dissipating module includes a main body, a heat dissipating unit, and at least one resilient engaging unit. A side of the heat dissipating unit is connected to the main body, and the other side of the heat dissipating unit is contacting against the at least one heat component; the at least one resilient engaging unit, an end of the at least one resilient engaging unit is connected to a side of the main body, the other end of the at least one resilient engaging unit is fixed on a side of the fastening base, and the at least one resilient engaging unit is for pressing the main body, so that the heat dissipating unit contacts against the at least one heat component.

According to the disclosure, the at least one heat component comprises a first heat component and a second heat component, the first heat component and the second heat component are not on a same plane, the main body comprises a first platform and a second platform, a step is formed between the first platform and the second platform, the heat dissipating unit comprises a first heat dissipating component and a second heat dissipating component, a side of the first heat dissipating component and a side of the second heat dissipating component are respectively connected to the first platform and the second platform, and the other side of the first heat dissipating component and the other side of the second heat dissipating component respectively contact against the first heat component and the second heat component.

According to the disclosure, the main body further comprises a third platform, the heat dissipating module further comprises a heat conducting component, a side of the heat conducting component is connected to the third platform, and the other side of the heat conducting component contacts with a casing, so as to transmit heat generated by the first heat component and the second heat component to the casing.

According to the disclosure, the first platform is extended to the second platform, and the second platform is extended to the third platform.

According to the disclosure, the at least one resilient engaging unit includes a resilient portion and a hook portion. An end of the resilient portion is connected to the main body, and the resilient portion is for resiliently pressing the main body; the hook portion is connected to the other end of the resilient portion, and the hook portion is for engaging with the side of the fastening base.

According to the disclosure, the at least one resilient engaging unit further comprises a separating portion connected to the hook portion, and the separating portion is for driving the hook portion to separate from the side of the fastening base as being pressed.

According to the disclosure, the resilient portion is riveted to the main body.

According to the disclosure, the heat dissipating module further includes a forcing portion connected to the other end of the resilient portion.

According to the disclosure, the hook portion is pivotally connected to the other end of the resilient portion, and the separating portion drives the hook portion to pivot as being pressed, so as to separate the hook portion from the side of the fastening base.

According to the disclosure, the heat dissipating module further includes a heat conducting component, a side of the heat conducting component being connected to the main body, and the other side of the heat conducting component contacting with a casing, so as to transmit heat generated by the at least one heat component to the casing.

According to the disclosure, the heat dissipating module further includes two resilient engaging units respectively disposed at two sides of the main body.

According to the disclosure, an electronic device includes a casing, a fastening base, at least one heat component and a heat dissipating unit. The fastening base is installed inside the casing; the at least one heat component is installed on the fastening base; the heat dissipating unit is fixed on the fastening base and is contacting against the at least one heat component. The heat dissipating module includes a main body, a heat dissipating unit and at least one resilient engaging unit. A side of the heat dissipating unit is connected to the main body, and the other side of the heat dissipating unit contacting against the at least one heat component. An end of the at least one resilient engaging unit is connected to a side of the main body, the other end of the at least one resilient engaging unit is fixed on a side of the fastening base, and the at least one resilient engaging unit is for pressing the main body, so that the heat dissipating unit contacts against the at least one heat component.

According to the disclosure, the electronic device further including at least one fixing component, wherein at least one fixing hole is formed on at least one side of the third platform, at least one hole relative to the at least one fixing hole is formed on the casing, and the at least one fixing component passes through the at least one fixing hole and the at least one hole, so that the heat conducting component contacts against the casing.

The present invention disposes the heat dissipating components and the heat conducting component on the main body, so that the heat dissipating components contact the heat components and the heat conducting component contacts the casing of the electronic device without the fan. As a result, the heat generated by the heat components can be transmitted to the casing via the heat dissipating components, the main body and the heat conducting component quickly, and then the casing transmits the heat to the outside environment of the electronic device, so as to achieve a purpose of dissipating the heat quickly. In addition, the heat dissipating module further includes the at least one resilient engaging unit for facilitating the heat dissipating module to install on the fastening base with the heat components. As a result, the present invention solves a problem of dissipating heat from the electronic device without the fan by forming the holes on the casing in the prior art, resulting in that the conventional electronic device cannot have waterproof and dustproof functions.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
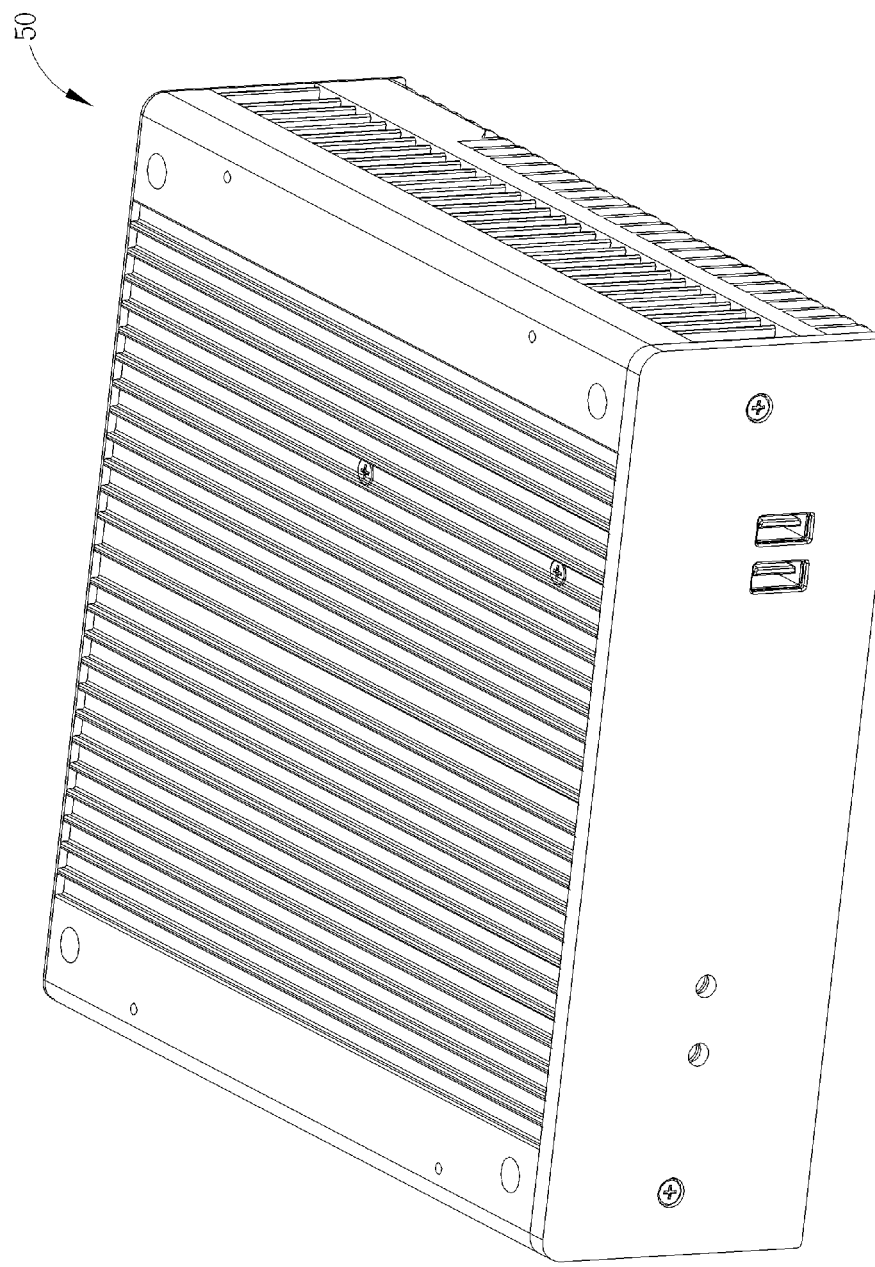
FIG. 1 is a diagram of an electronic device according to an embodiment of the present invention.
Figure 2:
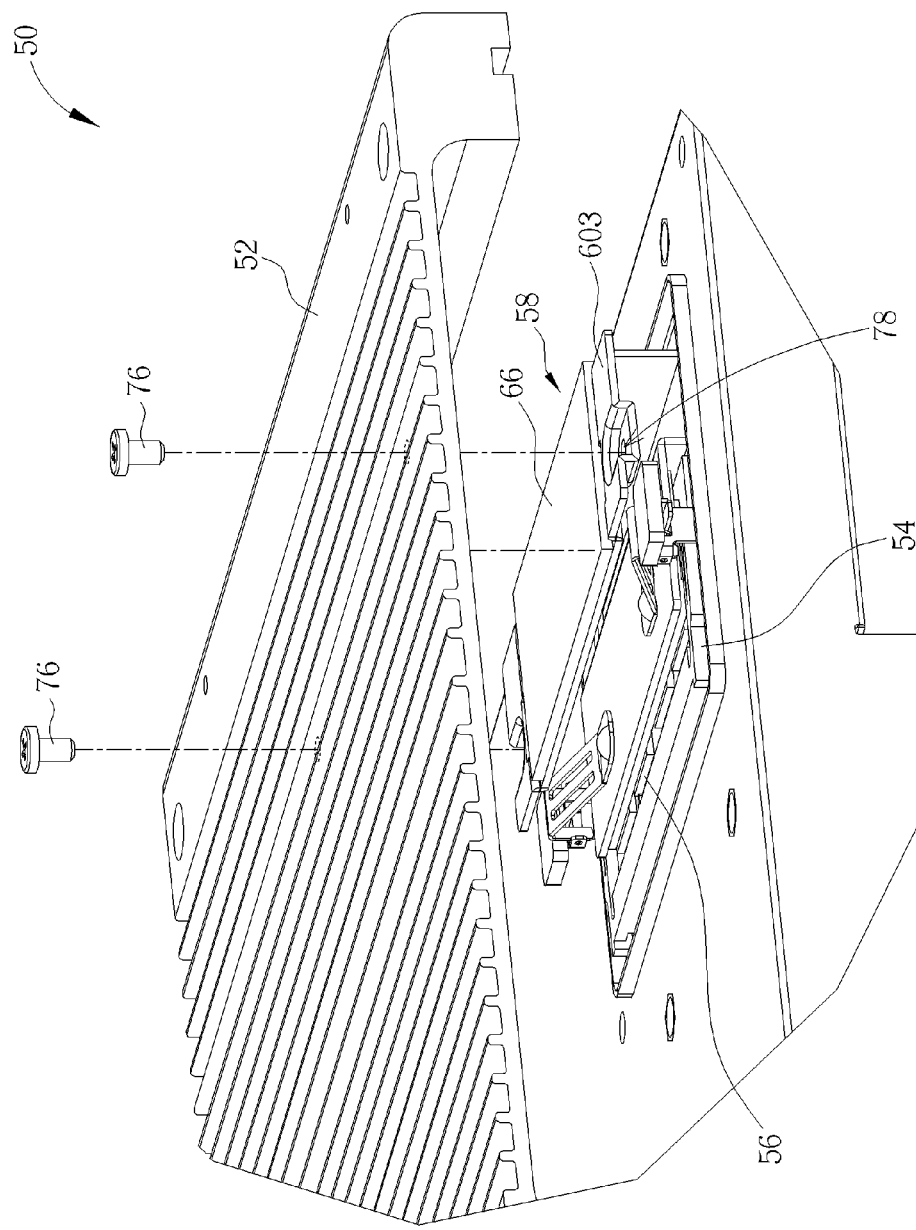
FIG. 2 is a partial exploded diagram of the electronic device according to the embodiment of the present invention.

Please refer to FIG. 1 and FIG. 2. FIG. 1 is a diagram of an electronic device 50 according to an embodiment of the present invention. FIG. 2 is a partial exploded diagram of the electronic device 50 according to the embodiment of the present invention. The electronic device 50 includes a casing 52, a fastening base 54, at least one heat component 56 and a heat dissipating module 58. The electronic device 50 can be a desktop computer, a notebook computer, a barebone computer, a business server computer, and so on. The fastening base 54 can be a memory socket installed inside the casing 52. The heat component 56 can be a memory installed on the fastening base 54 correspondingly. The memory can be inserted into the memory slot to electrically connect to a circuit board inside the casing 52, and the memory generates heat as the electronic device 50 is in operation. In this embodiment, the electronic device 50 can be an industrial computer or a business computer. For meeting design demand of being dustproof and waterproof, or disposing no hole on the casing 52, the electronic device 50 can be configured without a fan or holes on the casing 52 for dissipating the heat. Because the electronic device 50 may be disposed in a closed environment and the air convection is not well, it is needed to dispose the heat dissipating module 58 to dissipate the heat generated by the at least one heat component 56, such as the memory, and the heat dissipating module 58 transmits the heat to the casing 52 of the electronic device 50, so as to decrease an operation temperature of the memory.

Figure 3:
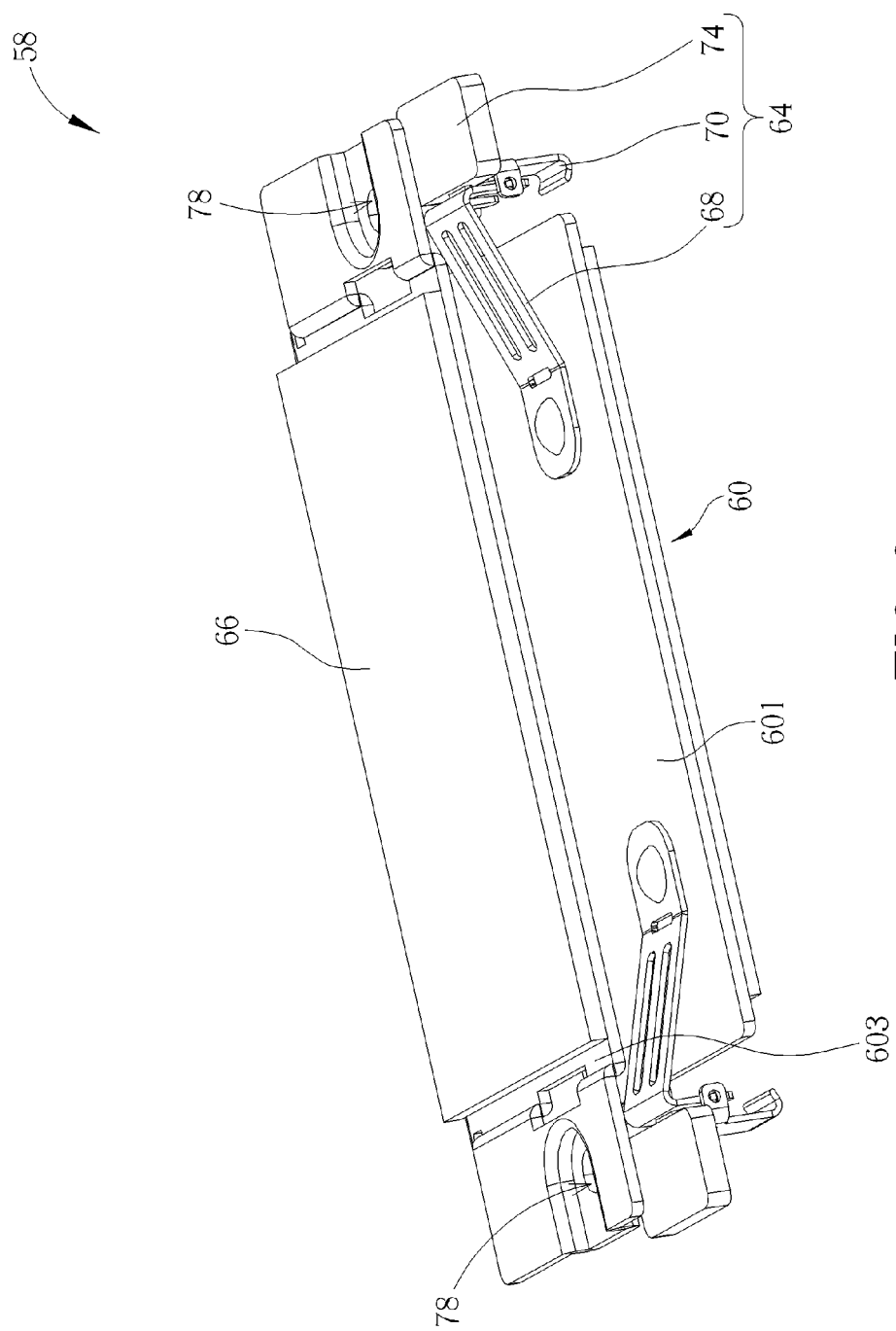
FIG. 3 and FIG. 4 are respectively diagrams of a heat dissipating module in different views according to the embodiment of the present invention.
Figure 4:
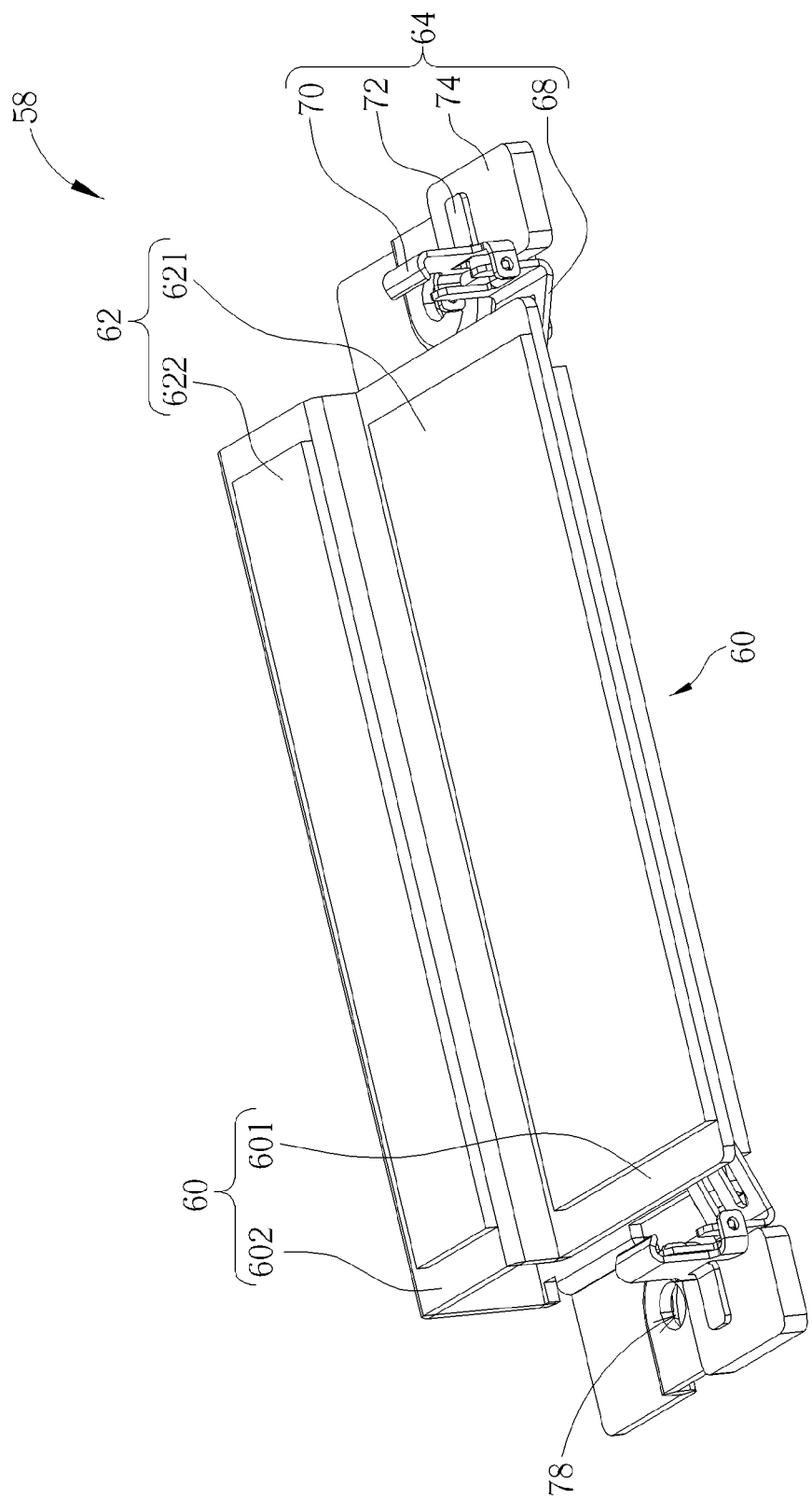
Figure 5:
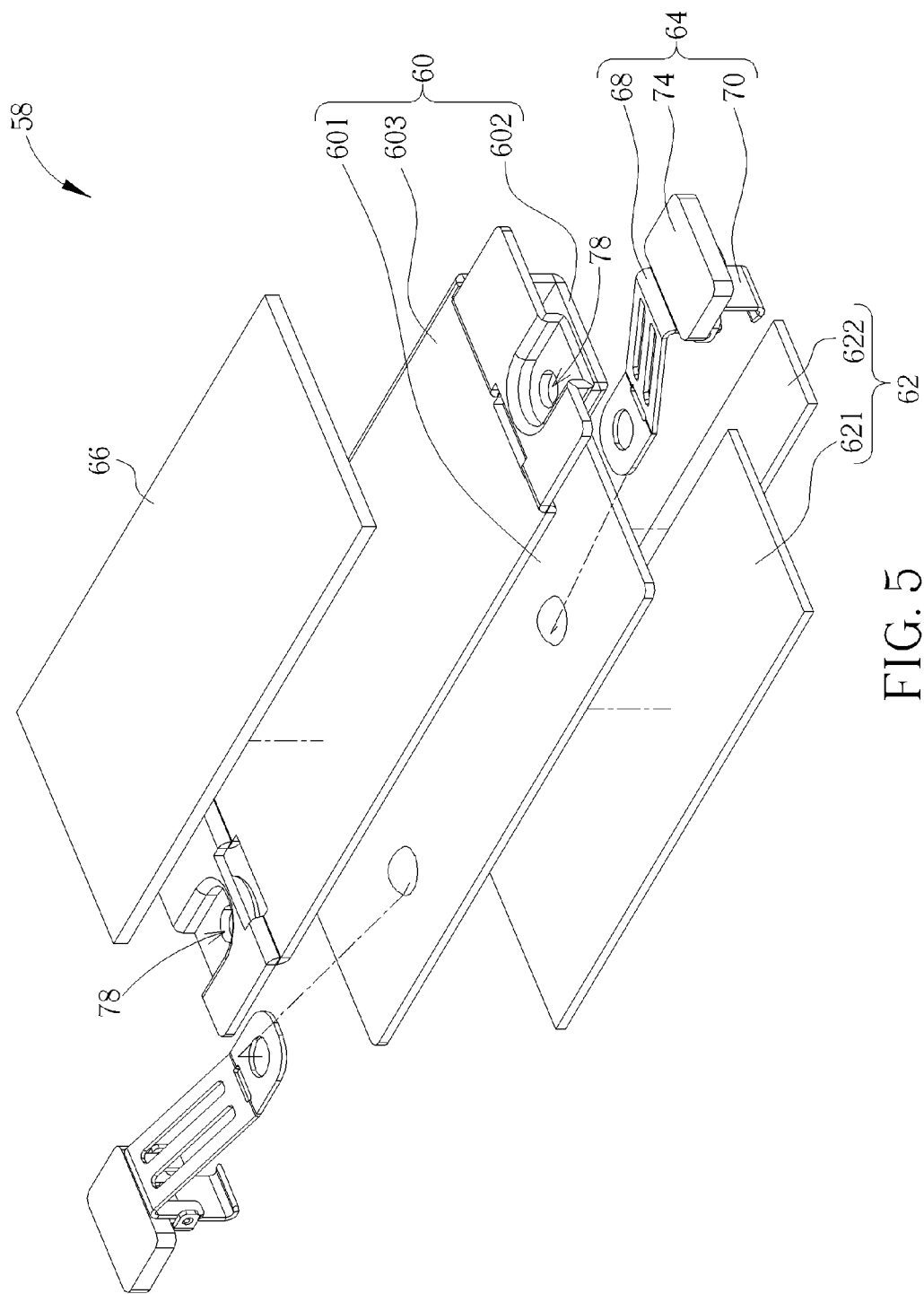
FIG. 5 is an exploded diagram of the heat dissipating module according to the embodiment of the present invention.

Please refer to FIG. 2 to FIG. 5. FIG. 3 and FIG. 4 are respectively diagrams of the heat dissipating module 58 in different views according to the embodiment of the present invention. FIG. 5 is an exploded diagram of the heat dissipating module 58 according to the embodiment of the present invention. The heat dissipating module 58 includes a main body 60, a heat dissipating unit 62 and at least one resilient engaging unit 64. The main body 60 is made of a thermal conductor with a high thermal conduction coefficient, such as metal. The main body 60 includes a first platform 601, a second platform 602 and a third platform 603. The first platform 601 is extended to the second platform 602. The second platform 602 is extended to the third platform 603. The first platform 601, the second platform 602 and the third platform 603 are parallel to one another. A side of the heat dissipating unit 62 is connected to the main body 60, and the other side of the heat dissipating unit 60 contacts against the at least one heat component 56. In this embodiment, the heat dissipating unit 62 includes a first heat dissipating component 621 and a second heat dissipating component 622. A side of the first heat dissipating component 621 and a side of the second heat dissipating component 622 are respectively connected to the first platform 601 and the second platform 602, and the other side of the first heat dissipating component 621 and the other side of the second heat dissipating component 622 respectively contact against the at least one heat component 56. The heat dissipating unit 62 can be a thermal pad made of a soft material, such as a soft thermal pad with a high thermal conduction coefficient or a soft silicon thermal pad with the high thermal conduction coefficient, which can transmit the heat generated by the at least one heat component 56 to the main body 60 quickly.

In this embodiment, the first heat dissipating component 621 and the second heat dissipating component 622 installed on the first platform 601 and the second platform 602 are respectively for dissipating the heat generated by different heat components. The present invention can also be designed to dispose a combination of only one platform and one heat dissipating component to dissipate the heat generated by a set of the heat component, or dispose a combination of three platforms and three heat dissipating components to dissipate the heat generated by three sets of the heat components. Different height differences can be formed between different platforms, and it depends on practical design demand. In addition, the electronic device 50 further includes a heat conducting component 66, a side of the heat conducting component 66 is connected to the third platform 603, and the other side of the heat conducting component 66 contacts against the casing 52, so as to transmit the heat generated by the at least one heat component 56 to the casing 52. In this embodiment, the heat dissipating module 58 includes two resilient engaging units 64 respectively disposed at two different sides of the main body 60. Amounts and positions of the resilient engaging units 64 are not limited to this embodiment, and it depends on practical design demand. An end of each resilient engaging unit 64 is connected to a side of the main body 60, the other end of each resilient engaging unit 64 is fixed on a side of the fastening base 54, and the resilient engaging unit 64 is for pressing the main body 60, so that the heat dissipating unit 62 contacts against the corresponding heat component 56 closely.

Figure 6:
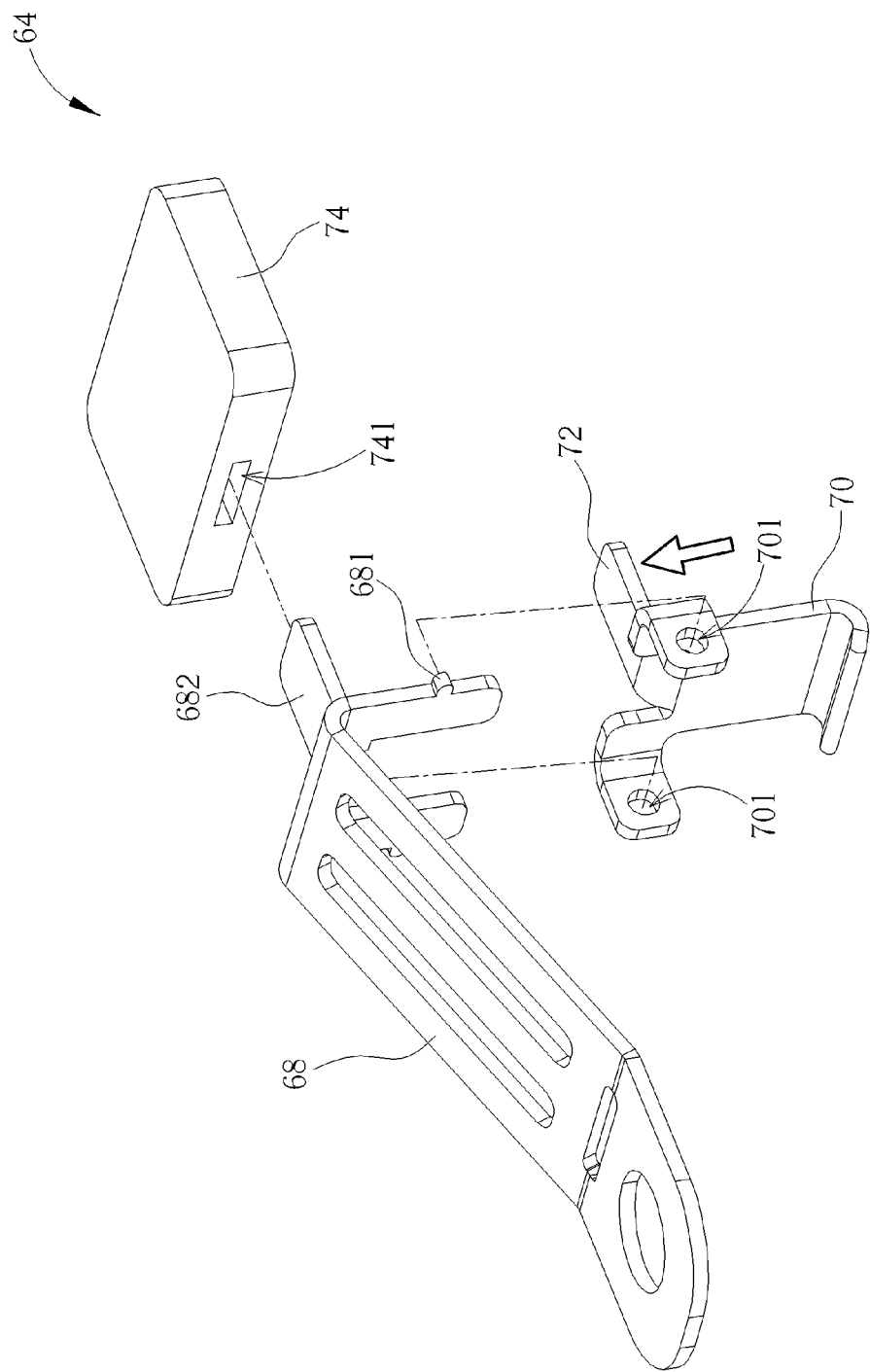
FIG. 6 is an exploded diagram of a resilient engaging unit according to the embodiment of the present invention.

Please refer to FIG. 2 to FIG. 6. FIG. 6 is an exploded diagram of the resilient engaging unit 64 according to the embodiment of the present invention. The resilient engaging unit 64 includes a resilient portion 68, a hook portion 70, a separating portion 72 and a forcing portion 74. As shown in FIG. 3, an end of the resilient portion 68 is connected to the main body 60, and the resilient portion 68 is for resiliently pressing the first platform 601 of the main body 60. The resilient portion 68 can be riveted to the first platform 601 of the main body 60, and the resilient portion 68 is made of a resilient material. The hook portion 70 is connected to the other end of the resilient portion 68, and the portion 70 is for engaging with the side of the fastening base 54 illustrated in FIG. 2. The hook portion 70 can be pivoted to the other end of the resilient portion 68. As shown in FIG. 6, two perforations 701 are formed on the hook portion 70, and the resilient portion 68 includes two protrusions 681. The two perforations 701 respectively sheath the two protrusions 681, so that the hook portion 70 can pivot relative to the resilient portion 68. The separating portion 72 is connected to the hook portion 70, and the separating portion 72 is for driving the hook portion 70 to pivot, so as to separate from the side of the fastening base 54, as being pressed. The separating portion 72 and the hook portion 70 can be integrally formed. The forcing portion 74 is connected to the other end of the resilient portion 68, and the forcing portion 74 is for providing the separating portion 72 with a forcing position to press. For example, a user can contact against a top side of the forcing portion 74 by the user's thumb and force the separating portion 72 by the user's forefinger, so that the separating portion 72 pivots close to the forcing portion 74, so as to drive the hook portion 70 to separate from the side of the fastening base 54. Moreover, the resilient portion 68 includes a protruding piece 682, and a groove 741 is formed on the forcing portion 74. The protruding piece 682 of the resilient portion 68 can be inserted into the groove 741 of the forcing portion 74, so that the forcing portion 74 is fixed with the resilient portion 68.

Figure 7:
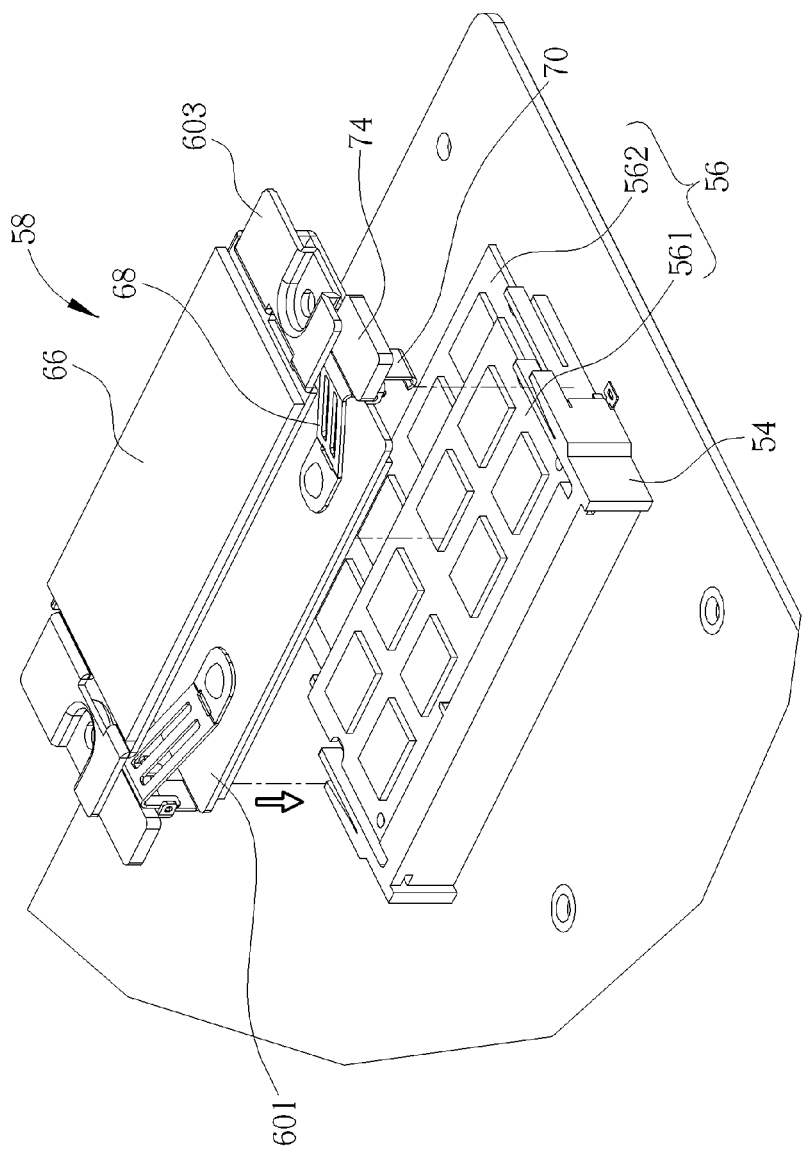
FIG. 7 is an inner structural diagram of the electronic device according to the embodiment of the present invention.
Figure 8:
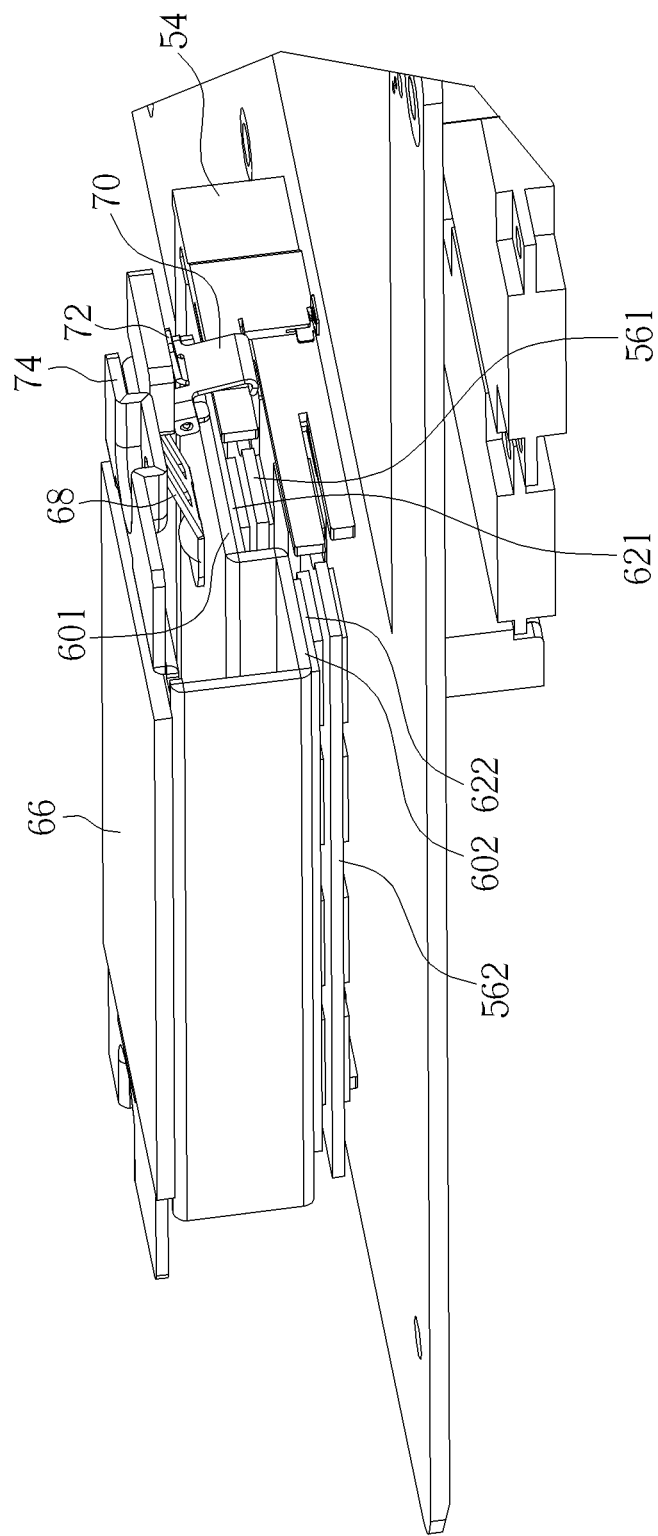
FIG. 8 is a diagram of the heat dissipating module installing on a fastening base according to the embodiment of the present invention.
Figure 9:
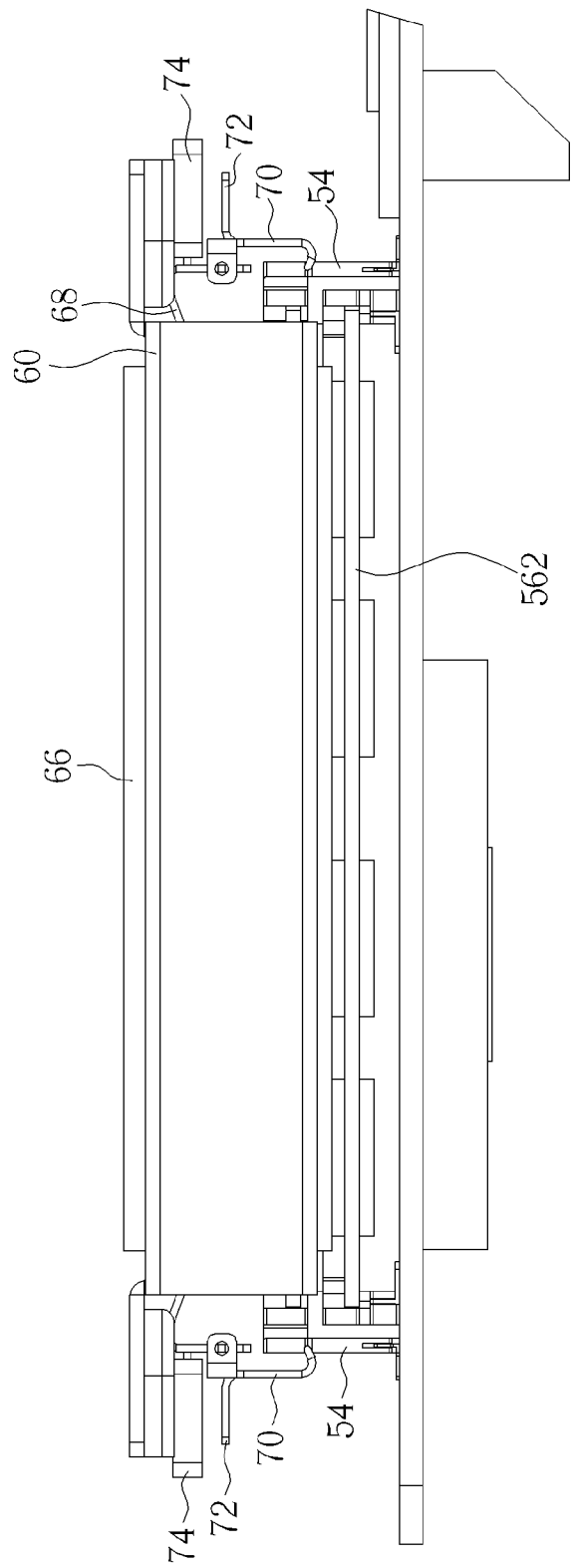
FIG. 9 is a side view of the heat dissipating module installing on the fastening base according to the embodiment of the present invention.

Next, an assembly of installing the heat dissipating module 58 inside the casing 52 is described as follows. Please refer to FIG. 7 to FIG. 9. FIG. 7 is an inner structural diagram of the electronic device 50 according to the embodiment of the present invention. FIG. 8 is a diagram of the heat dissipating module 58 installing on the fastening base 54 according to the embodiment of the present invention. FIG. 9 is a side view of the heat dissipating module 58 installing on the fastening base 54 according to the embodiment of the present invention. In this embodiment, the at least one heat component 56 can include a first heat component 561 and a second heat component 562. That is, two memories can be inserted on the fastening base 54. First, the first platform 601 and the second platform 602 are respectively aligned to the first heat component 561 and the second heat component 562, and then the first platform 601 and the second platform 602 get close to the first heat component 561 and the second heat component 562 in an arrow direction as shown in FIG. 7. Then, the user can contact against the top side of the forcing portion 74 by the user's thumb and force the separating portion 72 by the user's forefinger, so that the separating portion 72 pivots close to the forcing portion 74. At this time, as shown in FIG. 8, the separating portion 72 drives the hook portion 70 to pivot relative to the resilient portion 68. As the first heat dissipating component 621 on the first platform 601 and the second heat dissipating component 622 on the second platform 602 respectively contact against the first heat component 561 and the second heat component 562, the user can release the separating portion 72 and the forcing portion 74. At this time, the hook portion 70 and the separating portion 72 pivot relative to the resilient portion 68 in a direction far away from the forcing portion 74. Finally, as shown in FIG. 9, the two hook portions 70 connected to the two sides of the main body 60 are respectively engaged to the two sides of the fastening base 54. As a result, the heat dissipating module 58 is installed on the fastening base 54. The heat dissipating unit 58 can be installed on the fastening base 54 or be detached from the fastening base 54 quickly with the resilient engaging unit 64.

Figure 10:
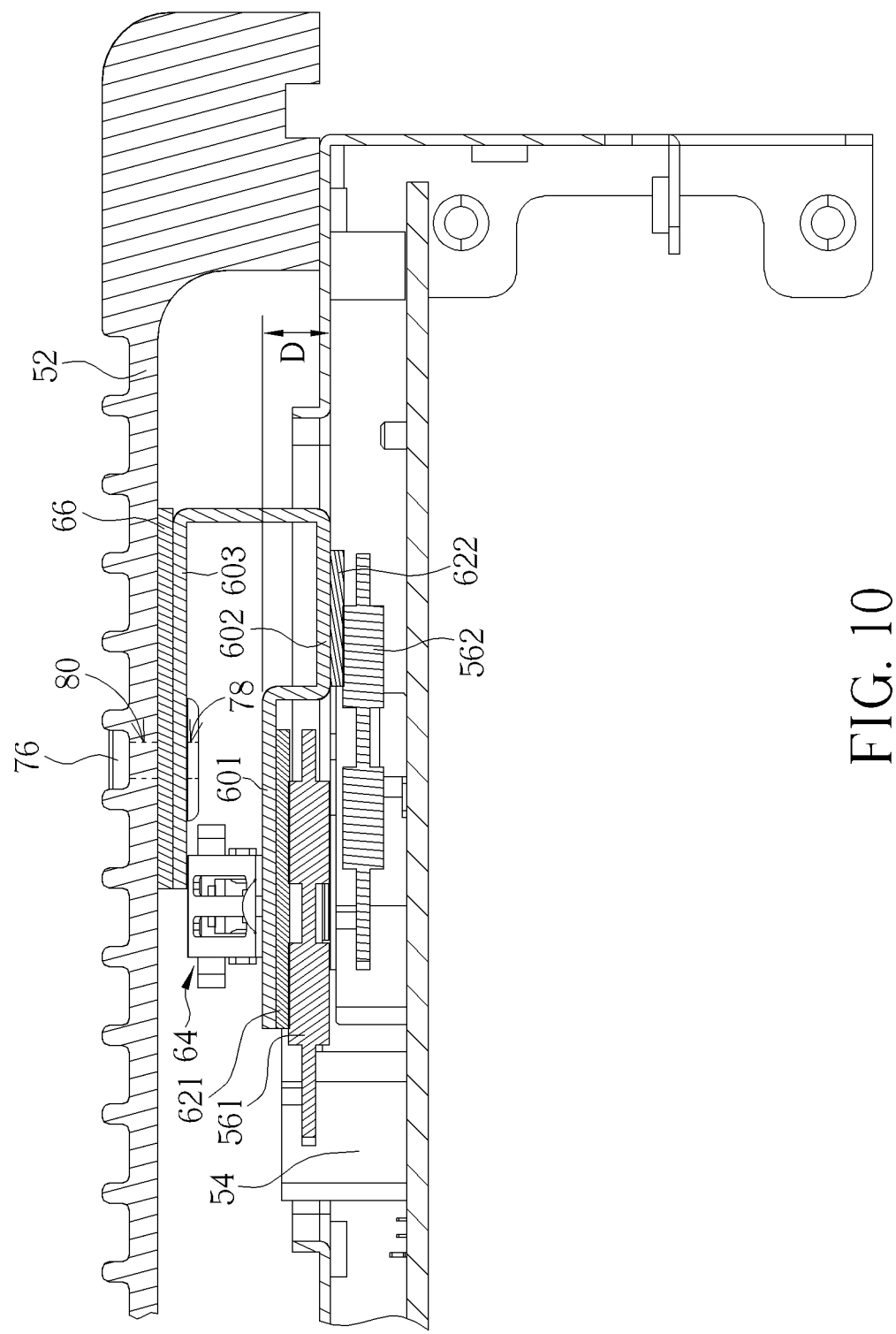
FIG. 10 is an inner structural diagram of the electronic device according to the embodiment of the present invention.

Moreover, please refer to FIG. 2 and FIG. 10. FIG. 10 is an inner structural diagram of the electronic device 50 according to the embodiment of the present invention. The electronic device 50 further includes at least one fixing component 76. At least one fixing hole 78 is formed on a side of the third platform 603, and at least one hole 80 is formed on the casing 52 corresponding to the at least one fixing hole 78. Each fixing component 76 passes through the corresponding fixing hole 78 and the hole 80, so that the heat conducting component 66 contacts against the casing 52 to increase thermal conduction efficiency. In this embodiment, the electronic device 50 includes two fixing components 76, and each fixing component 76 is a screw. The two fixing holes 78 are respectively formed on two sides of the third platform 603, and the two holes 80 are formed on the casing 52. The two screws pass through the two holes 80 and the two fixing holes 78 to screw the third platform 603 to the casing 52, so that the heat conducting component 66 contacts against the casing closely. Therefore, the heat generated by the first heat component 561 and the second heat component 562 can be transmitted to the casing 52. That is, the heat generated by the first heat component 561 and the second heat component 562 can be respectively transmitted to the first heat dissipating component 621 and the second heat dissipating component 622, and the first heat dissipating component 621 and the second heat dissipating component 622 respectively transmit the heat to the first platform 601 and the second platform 602 of the main body 60. Because the main body 60 is made of the thermal conductor with the high thermal conduction coefficient, the heat is transmitted from the first platform 601 and the second platform 602 to the third platform 603, and then the heat is transmitted to the casing 52 via the heat conducting component 66. After that, the casing 52 dissipates the heat to an outside environment, so that a temperature inside the casing 52 is less than an allowable operation temperature of inner components. For example, the temperature of the memory can decrease 6 to 15° C. by disposing the heat dissipating module 58 of the present invention in the electronic device 50 without the fan and the holes. For example, the temperature of the memory can decrease 15° C. as the electronic device 50 is in a high loading operation, so as to achieve a purpose that an operation system of the electronic device 50 works stably. It is noticed that a step D can be formed between the first platform 601 and the second platform 602. The step D is for cooperating the first heat component 561 and the second heat component 56 in different positions on the fastening base 54.

In contrast to the prior art, the present invention disposes the heat dissipating components and the heat conducting component on the main body, so that the heat dissipating components contact the heat components and the heat conducting component contacts the casing of the electronic device without the fan. As a result, the heat generated by the heat components can be transmitted to the casing via the heat dissipating components, the main body and the heat conducting component quickly, and then the casing transmits the heat to the outside environment of the electronic device, so as to achieve a purpose of dissipating the heat quickly. In addition, the heat dissipating module further includes the at least one resilient engaging unit for facilitating the heat dissipating module to install on the fastening base with the heat components. As a result, the present invention solves a problem of dissipating heat from the electronic device without the fan by forming the holes on the casing in the prior art, resulting in that the conventional electronic device cannot have waterproof and dustproof functions.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A heat dissipating module fixed on a fastening base and contacting against at least one heat component, the at least one heat component comprising a first heat component and a second heat component, the first heat component and the second heat component being not on a same plane, the heat dissipating module comprising:
   a main body comprising a first platform and a second platform, a step being formed between the first platform and the second platform;
   a heat dissipating unit comprising a first heat dissipating component and a second heat dissipating component, a side of the first heat dissipating component and a side of the second heat dissipating component respectively being connected to the first platform and the second platform, and another side of the first heat dissipating component and another side of the second heat dissipating component respectively contacting against the first heat component and the second heat component; and
   at least one resilient engaging unit, an end of the at least one resilient engaging unit being connected to a side of the main body, another end of the at least one resilient engaging unit being fixed directly to a side of the fastening base, and the at least one resilient engaging unit being for pressing the main body, so that the heat dissipating unit contacts against the at least one heat component.

2. The heat dissipating module of claim 1, wherein the main body further comprises a third platform, the heat dissipating module further comprises a heat conducting component, a side of the heat conducting component is connected to the third platform, and another side of the heat conducting component contacts against a casing, so as to transmit heat generated by the first heat component and the second heat component to the casing.

3. The heat dissipating module of claim 2, wherein the first platform is extended to the second platform, and the second platform is extended to the third platform.

4. The heat dissipating module of claim 1, wherein the at least one resilient engaging unit comprises: a resilient portion, an end of the resilient portion being connected to the main body, and the resilient portion being for resiliently pressing the main body; and a hook portion connected to another end of the resilient portion, and the hook portion being for engaging with the side of the fastening base.

5. The heat dissipating module of claim 4, wherein the at least one resilient engaging unit further comprises a separating portion connected to the hook portion, and the separating portion is for driving the hook portion to separate from the side of the fastening base as being pressed.

6. The heat dissipating module of claim 4, wherein the resilient portion is riveted to the main body.

7. The heat dissipating module of claim 4, further comprising a forcing portion connected to the another end of the resilient portion.

8. The heat dissipating module of claim 4, wherein the hook portion is pivotally connected to the another end of the resilient portion, and the separating 30 portion drives the hook portion to pivot as being pressed, so as to separate the hook portion from the side of the fastening base.

9. The heat dissipating module of claim 1, further comprising a heat conducting component, a side of the heat conducting component being connected to the main body, and another side of the heat conducting component contacting with a casing, so as to transmit heat generated by the at least one heat component to the casing.

10. The heat dissipating module of claim 1, further comprising two resilient engaging units respectively disposed at two sides of the main body.

11. An electronic device, comprising:
    a casing;
    a fastening base installed inside the casing;
    at least one heat component installed on the fastening base; and
    a heat dissipating module fixed on the fastening base and contacting against the at least one heat component, the heat dissipating module comprising:
       a main body;
       a heat dissipating unit, a side of the heat dissipating unit being connected to the main body, and another side of the heat dissipating unit contacting against the at least one heat component; and
    at least one resilient engaging unit comprising:
       a resilient portion, an end of the resilient portion being connected to a side of the main body, and the resilient portion being for resiliently pressing the main body, so that the heat dissipating unit contacts against the at least one heat component; and
       a hook portion connected to another end of the resilient portion, and the hook portion being fixed directly to a side of the fastening base.

12. The electronic device of claim 11, wherein the at least one heat component comprises a first heat component and a second heat component, the first heat component and the second heat component are not on a same plane, the main body comprises a first platform and a second platform, a step is formed between the first platform and the second platform, the heat dissipating unit comprises a first heat dissipating component and a second heat dissipating component, a side of the first heat dissipating component and a side of the second heat dissipating component are respectively connected to the first platform and the second platform, and another side of the first heat dissipating component and another side of the second heat dissipating component respectively contact against the first heat component and the second heat component.

13. The electronic device of claim 12, wherein the main body further comprises a third platform, the electronic device further comprises a heat conducting component, a side of the heat conducting component is connected to the third platform, and another side of the heat conducting component contacts against the casing, so as to transmit heat generated by the first heat component and the second heat component to the casing.

14. The electronic device of claim 13, further comprising at least one fixing component, wherein at least one fixing hole is formed on at least one side of the third platform, at least one hole is formed on the casing corresponding to the at least one fixing hole, and the at least one fixing component passes through the at least one fixing hole and the at least one hole, so that the heat conducting component contacts against the casing.

15. The electronic device of claim 11, wherein the at least one resilient engaging unit further comprises a separating portion connected to the hook portion, and the separating portion is for driving the hook portion to separate from the side of the fastening base as being pressed.

16. The electronic device of claim 11, further comprising a forcing portion connected to the other end of the resilient portion.

17. The electronic device of claim 11, wherein the hook portion is pivotally connected to the another end of the resilient portion, and the separating portion drives the hook portion to pivot as being pressed, so as to separate the hook portion from the side of the fastening base.

18. The electronic device of claim 11, further comprising a heat conducting component, a side of the heat conducting component being connected to the main body, and another side of the heat conducting component contacting with the casing, so as to transmit heat generated by the at least one heat component to the casing.

19. A heat dissipating module fixed on a fastening base and contacting against at least one heat component, the heat dissipating module comprising:

a main body;
a heat dissipating unit, a side of the heat dissipating unit being connected to the main body, and another side of the heat dissipating unit contacting against the at least one heat component; and
at least one resilient engaging unit comprising:
a resilient portion, an end of the resilient portion being connected to a side of the main body, and the resilient portion being for resiliently pressing the main body, so that the heat dissipating unit contacts against the at least one heat component; and
a hook portion connected to another end of the resilient portion, and the hook portion being fixed directly to a side of the fastening base.

20. The heat dissipating module of claim 19, wherein the at least one resilient engaging unit further comprises a separating portion connected to the hook portion, and the separating portion is for driving the hook portion to separate from the side of the fastening base as being pressed.

21. The heat dissipating module of claim 19, further comprising a forcing portion connected to the another end of the resilient portion.

22. The heat dissipating module of claim 19, wherein the hook portion is pivotally connected to the another end of the resilient portion, and the separating portion drives the hook portion to pivot as being pressed, so as to separate the hook portion from the side of the fastening base.

* * * * *